United States Patent [19]

Fukuda et al.

[11] Patent Number: 4,905,318
[45] Date of Patent: Feb. 27, 1990

[54] SEMICONDUCTOR HALL ELEMENT WITH MAGNETIC POWDER IN RESIN

[75] Inventors: Toshikazu Fukuda, Kawasaki; Toshihiro Kato, Chigasaki, both of Japan

[73] Assignee: Kabushiki Kaisha Toshiba, Kawasaki, Japan

[21] Appl. No.: 328,792

[22] Filed: Mar. 27, 1989

Related U.S. Application Data

[63] Continuation of Ser. No. 43,607, Apr. 28, 1987, abandoned.

[30] Foreign Application Priority Data

May 6, 1986 [JP] Japan .................. 61-102126

[51] Int. Cl.$^4$ ............................................ H01L 27/22
[52] U.S. Cl. ............................ 357/27; 357/72; 338/32 H
[58] Field of Search .................. 357/27, 72; 338/32 A

[56] References Cited

U.S. PATENT DOCUMENTS

| 4,021,767 | 5/1977 | Nonaka et al. ............... 357/27 X |
| 4,048,670 | 9/1977 | Eysermans ................... 357/27 X |

FOREIGN PATENT DOCUMENTS

| 0007587 | 2/1980 | European Pat. Off. . |
| 1449326 | 4/1969 | Fed. Rep. of Germany . |
| 0555870 | 1/1976 | Japan . |
| 58-164262 | 9/1983 | Japan .................. 357/27 X |
| 59-34681 | 2/1984 | Japan . |
| 0926250 | 5/1963 | United Kingdom ............. 357/27 X |
| 2143038 | 1/1985 | United Kingdom . |

*Primary Examiner*—William Mintel
*Attorney, Agent, or Firm*—Finnegan, Henderson, Farabow, Garrett and Dunner

[57] ABSTRACT

A highly magnetic Hall element comprising a substrate, a Hall element chip mounted on the substrate, and a magnetic member interposed between the substrate and the chip. The magnetic member increases the coercive force of the element, and is formed by laminating resin layers mixed with powder having a high magnetic permeability, one upon another, by stencil printing on that side of a semiconductor wafer in which a Hall element is mounted. The wafer and the magnetic member are diced together, to provide a Hall element chip. The magnetic member formed on the Hall element chip is adhered to substrate, with half-cured surface put in contact with the substrate.

7 Claims, 1 Drawing Sheet

SEMICONDUCTOR HALL ELEMENT WITH MAGNETIC POWDER IN RESIN

This application is a continuation of application Ser. No. 043,607, filed Apr. 28, 1987, now abandoned.

BACKGROUND OF THE INVENTION

This invention relates to a Hall element and, more particularly, to highly coercive Hall element prepared by bonding magnetic material to a Hall element chip, and also to the method of manufacturing the same. In the conventional highly coercive Hall element prepared from a semiconductor substrate of, for example, gallium arsenide, a magnetic body, which consists of a chip obtained from a solid substrate fabricated by baking ferrite in the form of a plate, is joined to the underside of the Hall element chip, in order to increase the coercive force of the Hall element.

Furthermore, in order to increase the coercive force in the magnetic circuit of the Hall element, a material has been prepared from a resin containing magnetic powder of low hysteresis and high magnetic permeability for joining to the surface of the Hall element chip.

The above-mentioned type of Hall element was fabricated by way of the undermentioned steps.

First, a soldering agent such as gold or germanium is mounted on a semiconductor substrate. The soldering agent is thermally melted, and a magnetic chip diced from a solid substrate of ferrite is mounted thereon. Then, soldering agent, again of gold or germanium, is mounted on the magnetic chip, and is fused.

A Hall element chip diced from a semiconductor wafer constituting the Hall element is placed on the magnetic chip, and a circuit pattern formed on the substrate is connected to the Hall element chip by gold wire bonding.

Lastly, a silicon encapping agent mixed with magnetic powder is dripped on the surface of the Hall element chip. The mass is hardened to provide magnetic powder-containing resin. Later, the resin is hermetically sealed.

However, the above-mentioned Hall element and the method of manufacturing the same are accompanied with the undermentioned difficulties. The magnetic chip is diced from the solid substrate. The magnetic chip and the Hall element chip are separately mounted, resulting in complexity of assembly. Therefore, such a Hall element is undesirably expensive and ill-suited for mass production.

Some concrete drawbacks, will now be described in more detail. For example, if misalignment occurs during the mounting of the Hall element on the magnetic chip, this may cause the Hall element to break off from the magnetic chip; the yield is consequently reduced; noticeable variations appear in the Hall output voltage and product sensitivity; and the conventional soldering agent applied when mounting the Hall element on the magnetic chip may undesirably cause the Hall element to easily detach from the chip. Any or all of these problems inevitably increase the cost of production.

The magnetic chip is obtained from a solid substrate which is prepared by baking ferrite formed in the shape of a plate. Baked ferrite is, however, quite brittle and cannot be made into thin sheets. Moreover, the thickness of the baked ferrite cannot be freely chosen, thereby limiting the degree of latitude as regards choosing the level of sensitivity of Hall element.

It is impossible with the existing production technique to reduce the thickness of a backed solid ferrite substrate to less than 0.2 mm. Consequently, a magnetic chip, which is sufficiently thin, cannot be produced. When, therefore, the Hall element is mounted on the magnetic chip, the height from the substrate to the Hall element chip is undesirably increased, presenting difficulties in adjusting a wire loop to an appropriate shape at the time of wire bonding. Consequently, bonding wire often tends to detach from its bonding, thereby reducing the manufacturing yield of the Hall element and reducing its reliability.

When it is assembled as part of a motor, the Hall element should be made as thin and as small as possible. However, due to the appreciable thickness of the magnetic chip, the conventional Hall element presents significant disadvantages as regards the possibility of miniaturization and reduction of its thickness.

SUMMARY OF THE INVENTION

The object of this invention is to provide a highly coercive Hall element which can be easily mass-produced at low cost, and to furnish a method of manufacturing the same.

The highly coercive Hall element embodying the present invention comprises a chip from which the Hall element is produced, a substrate on which the Hall element is to be mounted, and a resin layer which contains highly coercive powder and which is interposed between the substrate and the Hall element chip.

The highly coercive Hall element embodying the invention is manufactured through the steps of forming a resin layer, containing coercive powder, on that side of a semiconductor wafer on which a Hall element is formed; dicing both the semiconductor wafer and the resin layer jointly, to thereby provide a Hall element chip; adhering the semihardened surface of the resin layer mounted on the semiconductor wafer to a substrate; applying wire bonding to both the substrate and the Hall element chip; and encapping coercive powder-containing resin on the surface of the Hall element chip.

The coercive Hall element embodying the present invention offers advantages such as that the coercive property of a coercive element-containing resin layer can be freely chosen over a wide range by varying the amount of coercive powder mixed with the resin layer which is interposed between the substrate and Hall element chip, thereby broadening the latitude as regards choosing the level of sensitivity of the Hall element; the height of the resin layer can be freely chosen by varying the amount of highly coercive powders in the resin layer; and, consequently, it is possible to reduce the height of the complete Hall element and to reduce its size.

The method of manufacturing coercive Hall element according to the present invention has such merits as that the coercive resin layer is formed on the rearside of the semiconductor wafer bearing the Hall element, and both semiconductor wafer and resin layer are diced in a single step, to provide the Hall element chip; the semihardened surface of the resin layer formed on the Hall element chip is adhered to the substrate, thereby enabling the resin layer to act as a mounting adhesive and simplifying the assembly step; both the Hall element and the resin layer can be mounted on the substrate in a single step, thereby eliminating variations in the properties of the Hall element, which might otherwise be caused by misalignment during mounting, and consequently increasing the reliability of Hall element.

BRIEF DESCRIPTION OF THE DRAWINGS

More precisely, FIG. 1A is a sectional view showing a coercive powder-containing resin layer formed on the backside of a semiconductor wafer bearing the Hall element;

FIG. 1B is a sectional view of a Hall element chip obtained by dicing both the semiconductor wafer and resin layer by a single step;

FIG. 1C is a sectional view of the substrate with the Hall element chip and the resin layer mounted on it;

FIG. 1D is a sectional view of the Hall element which has undergone wire bonding; and FIG. 1E is a sectional view of the Hall element having an encapping material formed on it, said material containing coercive powder.

DETAILED DESCRIPTION OF THE PREFERRED EMBODIMENTS

Figure 1A:
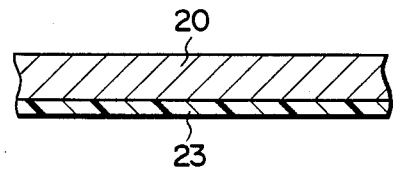
FIGS. 1A to 1E indicate the sequential steps of manufacturing coercive Hall element embodying the present invention.

Description may now be made with reference to the appended drawings of the method of manufacturing a Hall element embodying this invention. A resin material mixed with powder having high magnetic permeability is applied to the backside of gallium arsenide wafer 20 bearing the Hall element shown in FIG. 1A by means of stencil printing with a thickness of about 20 microns. Later, heat treatment is applied in the air or in an atmosphere of nitrogen kept at a temperature of 80° C. until the mixed resin material loses adhesivity and is rendered solid. The repetition of the above-mentioned stencil printing of a resin mixture and drying provides desired resin layer 23 having thickness of 100 microns.

The conditioning of the resin layer 23 is carried out by the steps of reacting 7.6 parts of epoxy resin, 5.6 parts of denatured resin and 5.0 parts of diethylene glycol diethyl ether (all measured in the weight ratio) by thermal dissolution to provide a viscous resin mass. A mass consisting of 18.0 parts of the resin mass, 0.006 part of a catalyst and 8.2 parts of powder of magnetic oxide, for example, $Fe_2O_3$, is formed. All the masses are kneaded on three rolls for defoaming.

Figure 1B:
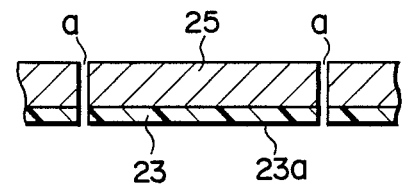
Figure 1C:
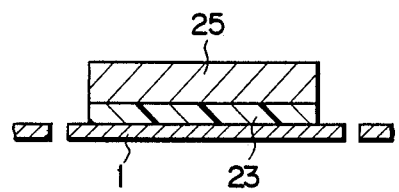

Later, as shown in FIG. 1B, the semiconductor wafer 20 and the resin layer 23 are diced together at a line by a diamond blade, thereby providing a Hall element chip 25. Surface 23a of the resin layer 23 still remains in a half-hardened state. As indicated in FIG. 1C, surface 23a of the resin layer 23 is adhered to a substrate 1 at a temperature of 250° C. for 1 minute in an atmosphere of nitrogen, thereby causing the Hall element chip 25 to be mounted in fact on substrate 1.

Figure 1D:
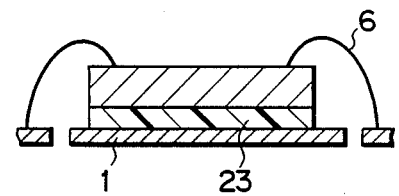

Therefore, the Hall element chip 25 and the substrate 1 are connected to each other by wire bonding 6, as shown in FIG. 1D.

Figure 1E:
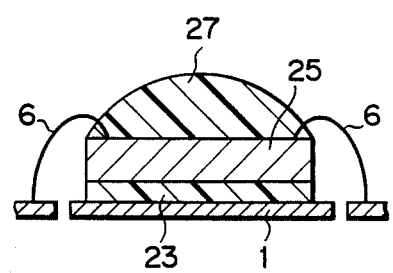
Figure 2:
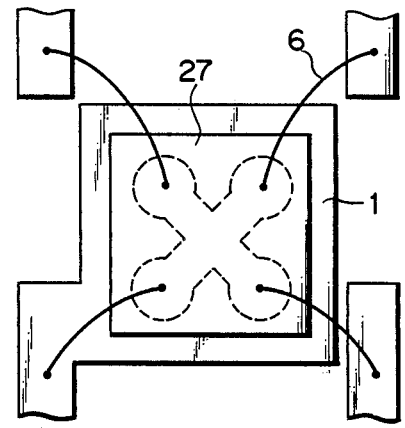
FIG. 2 is a plan view of the Hall element according to the present invention.

Further, a silicon rubber resin or an epoxy resin containing powder of magnetic oxide represented by MO.-$Fe_2O_3$ is dripped on the Hall element chip 25 for gelation, thereby providing encapping 27, as shown in FIG. 1E. Last, an envelope (not shown) is prepared from a sealing epoxy resin by injection molding. FIG. 2 is a plan view of the coercive Hall element shown in FIG. 1E. As illustrated, wire bondings 6 include those used for supplying input current to the Hall element and those used for leading output voltage from the Hall element.

The foregoing embodiment refers to the case where the resin layer 23 and the encapping 27 were prepared from powder of high magnetic permeability such as magnetic oxide represented by $Fe_2O_3$. However, this invention is not limited to this composition. Obviously, it is possible to apply powder of a metal of high magnetic permeability, for example, permalloy, or Sendust. In the aforementioned embodiment, the resin layer 23 and the encapping 27 were prepared from an epoxy resin. The epoxy resin may be selected from a broad range including bisphenol A resin, novolak type epoxy resin and various denatured resins.

What is claimed is:

1. A highly magnetic Hall element comprising:
   a substrate;
   a Hall element chip formed of a semiconductor wafer and mounted over said substrate, said Hall element chip having opposed first and second surfaces;
   a resin layer, including a magnetic powder, situated between the substrate and the first surface of said Hall element chip, a substantial portion of said resin layer being positioned beneath the first surface of said Hall element chip, said resin layer adhering said Hall element chip to said substrate;
   an encap including a resin mixed with a magnetic powder, a substantial portion of said encap being positioned over the second surface of said Hall element chip, magnetic flux passing through said encap and traveling toward the second surface of said Hall element chip, said encap being thickest in a portion corresponding to a center portion of said Hall element chip;
   bonding wires, connecting two pairs of electrodes of said Hall element chip and lead portions of said substrate; and
   said sealing material sealing the encap, the Hall element chip, bonding wires, the substrate, and the resin layer.

2. A highly magnetic Hall element according to claim 1, wherein the powder in said resin layer is a magnetic oxide.

3. A highly magnetic Hall element according to claim 1, wherein the powder in said resin layer is a metal powder having a magnetic permeability higher than that of a sealing epoxy resin.

4. A highly magnetic Hall element according to claim 1, wherein said resin layer is prepared from epoxy-base resin.

5. A highly magnetic Hall element according to claim 1, wherein the powder mixed with the resin forming said encap is a magnetic oxide.

6. A highly magnetic Hall element according to claim 1, wherein the resin forming said encap is an epoxy-base resin.

7. A highly magnetic Hall element according to claim 1, wherein said resin forming said encap is a silicon rubber resin.

* * * * *